US009343498B2

(12) United States Patent
Saito

(10) Patent No.: US 9,343,498 B2
(45) Date of Patent: May 17, 2016

(54) SEMICONDUCTOR DEVICE, IMAGING DEVICE AND SEMICONDUCTOR DEVICE MANUFACTURING METHOD

(71) Applicant: OLYMPUS CORPORATION, Tokyo (JP)

(72) Inventor: Haruhisa Saito, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/734,240

(22) Filed: Jun. 9, 2015

(65) Prior Publication Data

US 2015/0270304 A1 Sep. 24, 2015

Related U.S. Application Data

(63) Continuation of application No. PCT/JP2013/079844, filed on Nov. 5, 2013.

(30) Foreign Application Priority Data

Dec. 14, 2012 (JP) .................................. 2012-273661

(51) Int. Cl.
*H01L 21/78* (2006.01)
*H01L 23/00* (2006.01)
(Continued)

(52) U.S. Cl.
CPC .......... *H01L 27/14634* (2013.01); *H01L 21/48* (2013.01); *H01L 21/50* (2013.01);
(Continued)

(58) Field of Classification Search
CPC ......... H01L 24/94; H01L 24/89; H01L 25/50; H01L 21/78; H01L 2224/08112; H01L 2224/08135; H01L 2224/8012
See application file for complete search history.

(56) References Cited

U.S. PATENT DOCUMENTS 6,559,531 B1 * 5/2003 Sutherland .............. H01L 23/48
257/457
8,053,900 B2 * 11/2011 Yu ........................... H01L 24/05
257/774

(Continued)

FOREIGN PATENT DOCUMENTS

JP    2003-7764 A      1/2003
JP    2006-332141 A   12/2006

(Continued)

OTHER PUBLICATIONS

Takeda et al., "Uncontrollable movement toward 3D stacking—Cutting-edge technologies and industry trends of 2.5D/3D stacked devices for practical application—Open research meeting document of 3rd system integration packaging technology research meeting", Association of Super-Advanced Electronics Technologies (ASET), Oct. 25, 2011, pp. 77-90.

(Continued)

*Primary Examiner* — Peniel M Gumedzoe
(74) *Attorney, Agent, or Firm* — Westerman, Hattori, Daniels & Adrian, LLP

(57) ABSTRACT

A semiconductor device manufacturing method includes a wafer stack manufacturing process and a dicing process. The wafer stack manufacturing process includes: a first wafer manufacturing process of manufacturing a resin film covering circuits and heated to a temperature higher than a glass transition point of the resin film, manufacturing first holes extending from a surface of the resin film to wirings of the circuits, and providing electrodes electrically connected to the wirings in the first holes to form a first wafer; a second wafer manufacturing process of manufacturing a resin film covering circuits and heated to a temperature lower than a glass transition point of the resin film, manufacturing second holes extending from a surface of the resin film to wirings of the circuits, and providing the electrodes electrically connected to the wirings in the second holes to form a second wafer; and a wafer bonding process.

3 Claims, 9 Drawing Sheets

(51) Int. Cl.
    *H01L 25/00* (2006.01)
    *H01L 27/146* (2006.01)
    *H01L 25/065* (2006.01)
    *H01L 23/48* (2006.01)
    *H01L 21/48* (2006.01)
    *H01L 21/50* (2006.01)

(52) U.S. Cl.
CPC ............... *H01L 21/78* (2013.01); *H01L 23/48* (2013.01); *H01L 24/11* (2013.01); *H01L 24/13* (2013.01); *H01L 24/16* (2013.01); *H01L 24/27* (2013.01); *H01L 24/83* (2013.01); *H01L 24/89* (2013.01); *H01L 24/92* (2013.01); *H01L 24/94* (2013.01); *H01L 25/0657* (2013.01); *H01L 25/50* (2013.01); *H01L 24/29* (2013.01); *H01L 24/32* (2013.01); *H01L 24/73* (2013.01); *H01L 24/81* (2013.01); *H01L 27/1469* (2013.01); *H01L 27/14636* (2013.01); *H01L 2224/0401* (2013.01); *H01L 2224/05568* (2013.01); *H01L 2224/05624* (2013.01); *H01L 2224/05644* (2013.01); *H01L 2224/08112* (2013.01); *H01L 2224/08135* (2013.01); *H01L 2224/1145* (2013.01); *H01L 2224/1146* (2013.01); *H01L 2224/1148* (2013.01); *H01L 2224/1184* (2013.01); *H01L 2224/11452* (2013.01); *H01L 2224/11472* (2013.01); *H01L 2224/13013* (2013.01); *H01L 2224/13017* (2013.01); *H01L 2224/13082* (2013.01); *H01L 2224/13144* (2013.01); *H01L 2224/13155* (2013.01); *H01L 2224/1411* (2013.01); *H01L 2224/16057* (2013.01); *H01L 2224/16106* (2013.01); *H01L 2224/27416* (2013.01); *H01L 2224/27436* (2013.01); *H01L 2224/2919* (2013.01); *H01L 2224/73104* (2013.01); *H01L 2224/73204* (2013.01); *H01L 2224/8012* (2013.01); *H01L 2224/81193* (2013.01); *H01L 2224/83193* (2013.01); *H01L 2224/83194* (2013.01); *H01L 2224/83855* (2013.01); *H01L 2224/83856* (2013.01); *H01L 2224/83862* (2013.01); *H01L 2224/9211* (2013.01); *H01L 2224/94* (2013.01); *H01L 2225/06513* (2013.01); *H01L 2924/12042* (2013.01)

(56) References Cited

U.S. PATENT DOCUMENTS

| | | | |
|---|---|---|---|
| 2003/0001253 | A1 | 1/2003 | Kurita |
| 2004/0048459 | A1* | 3/2004 | Patti ................ H01L 21/76898 438/612 |
| 2005/0101116 | A1* | 5/2005 | Tseng ............... H01L 21/76898 438/622 |
| 2007/0069394 | A1* | 3/2007 | Bachman ............... H01L 24/03 257/780 |
| 2008/0006938 | A1* | 1/2008 | Patti ................ H01L 21/76898 257/734 |
| 2011/0042814 | A1* | 2/2011 | Okuyama ............... H01L 24/06 257/758 |
| 2013/0112849 | A1* | 5/2013 | Shimotsusa ....... H01L 27/14634 250/206 |

FOREIGN PATENT DOCUMENTS

| | | |
|---|---|---|
| JP | 2007-73775 A | 3/2007 |
| JP | 2008-84951 A | 4/2008 |
| JP | 2008-205260 A | 9/2008 |

OTHER PUBLICATIONS

International Search Report dated Dec. 10, 2013 issued in corresponding application No. PCT/JP2013/079844 (4 pages).

* cited by examiner

SEMICONDUCTOR DEVICE, IMAGING DEVICE AND SEMICONDUCTOR DEVICE MANUFACTURING METHOD

CROSS REFERENCE TO RELATED APPLICATIONS

This application is a continuation application based on a PCT Patent Application No. PCT/JP2013/079844, filed Nov. 5, 2013, whose priority is claimed on Japanese Patent Application No. 2012-273661, filed Dec. 14, 2012, the entire content of which are hereby incorporated by reference.

BACKGROUND OF THE INVENTION

1. Field of the Invention

The present invention relates to a semiconductor device, an imaging device, and a semiconductor device manufacturing method.

2. Description of the Related Art

As methods of electrically connecting wafers in which semiconductor devices are provided to each other, active research and development is being carried out on methods of heating and pressing the wafers using a solder bump or a metal bump to connect the wafers and methods of connecting the wafers by heating adhesion using a resin, such as an anisotropic conductive adhesive material. In the research and development, a wafer stacking technology using a photosensitive resin is also being examined (e.g., see "Uncontrollable movement toward 3D stacking—Cutting-edge technologies and industry trends of 2.5D/3D stacked devices for practical application—Open research meeting document of $3^{rd}$ system integration packaging technology research meeting, Oct. 25, 2011, p. 77 to 90").

The wafer stacking technology using a photosensitive resin is as follows. In other words, a resin film is formed by spin-coating a liquid photosensitive resin or vacuum-laminating a photosensitive resin in the form of a sheet on a bonding surface of a wafer to be stacked. To bond wafers together, a resin film is heated not to a fully cured state but to a semi-cured state, a pattern is exposed and developed using a photo mask, and the resin film is subjected to post baking. An electrode for connection is formed using a plating method, a sputtering method, a vapor deposition method, or the like. After that, the electrode is flattened together with the resin film by chemical mechanical polishing (CMP), single point grinding, or the like, and heated and pressed to bond the wafers together.

SUMMARY

According to a first aspect of the present invention, a semiconductor device manufacturing method includes: a wafer stack manufacturing process of manufacturing a wafer stack in which a plurality of wafers including circuits and electrodes electrically connected to the circuits are stacked; and a dicing process of dicing the wafer stack. The wafer stack manufacturing process includes: a first wafer manufacturing process of manufacturing a resin film covering the plurality of circuits and heated to a temperature higher than a glass transition point of the resin film, manufacturing first holes extending from a surface of the resin film to wirings of the circuits, and providing the electrodes electrically connected to the wirings in the first holes to form a first wafer; a second wafer manufacturing process of manufacturing a resin film covering the plurality of circuits and heated to a temperature lower than a glass transition point of the resin film, manufacturing second holes extending from a surface of the resin film to wirings of the circuits, and providing the electrodes electrically connected to the wirings in the second holes to form a second wafer; and a wafer bonding process of causing respective electrode sides of the first wafer and the second wafer to be opposite to each other, bonding the respective resin films together by heating the resin film of the second wafer to a temperature higher than the glass transition point, and bonding the respective electrodes together to form a stack of the first wafer and the second wafer constituting at least a part of the wafer stack.

According to a second aspect of the present invention, in the manufacturing method of a semiconductor device relating to the first aspect, in a cross section including a lamination direction in which the plurality of wafers are stacked, a length of surfaces of the electrodes of the first wafer on a bonding-portion side between the electrodes of the first wafer and the electrodes of the second wafer is shorter than a length of surfaces of the electrodes of the second wafer on the bonding-portion side.

According to a third aspect of the present invention, in the manufacturing method of a semiconductor device relating to the first aspect, when the semiconductor device is viewed in a lamination direction in which the plurality of wafers are stacked, surfaces of the electrodes of the first wafer on a bonding-portion side between the electrodes of the first wafer and the electrodes of the second wafer are formed in edge portions of surfaces of the electrodes of the second wafer on the bonding-portion side.

According to a fourth aspect of the present invention, in a semiconductor device, chips having circuits and electrodes which are electrically connected to the circuits are stacked. Among the plurality of chips, each chip of at least one pair of chips opposite to each other has a resin film which is heated to a temperature higher than a glass transition point of the resin film on a counterface of the resin film. In comparison with the electrodes of one chip of the at least one pair of chips opposite to each other, the electrodes of the other chip of the at least one pair of chips opposite to each other is formed to increase in diameter toward a bonding portion in which the electrodes are bonded together. The at least one pair of chips opposite to each other are bonded together on the resin films and also bonded together on the electrodes.

According to a fifth aspect of the present invention, an imaging device includes the semiconductor device relating to the fourth aspect.

DETAILED DESCRIPTION OF THE PREFERRED EMBODIMENTS

Hereinafter, a semiconductor device and an imaging device relating to an embodiment of the present invention will be described with reference to FIG. 1 to FIG. 19. Since each drawing is a schematic diagram, shapes and sizes are exaggerated (likewise in the following drawings).

Figure 1:
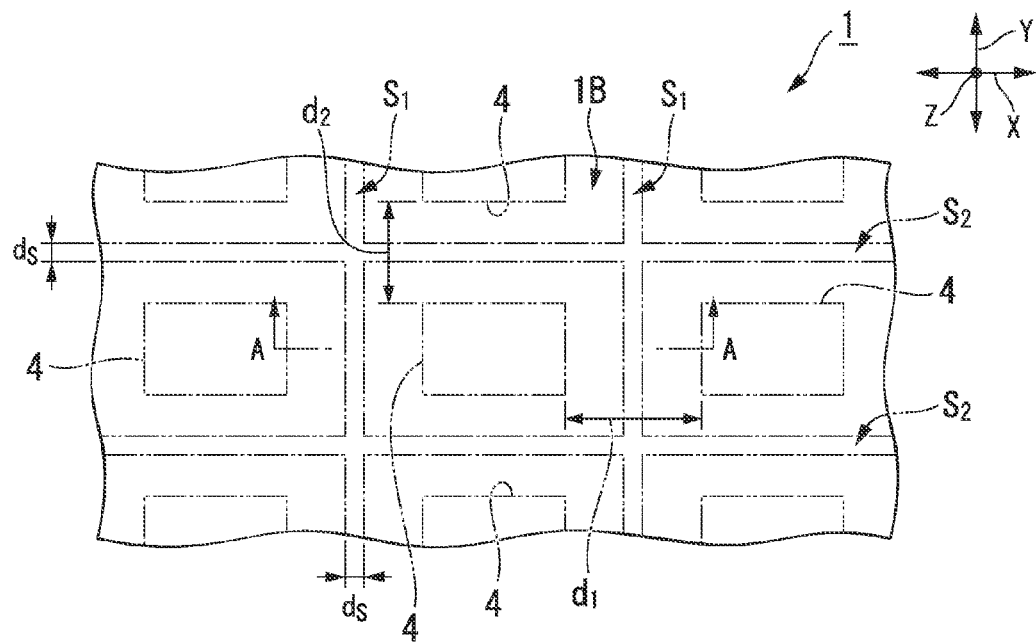
FIG. 1 is a schematic plan view showing a part of a wafer stack which is diced to manufacture semiconductor devices relating to a first embodiment of the present invention.
Figure 2:
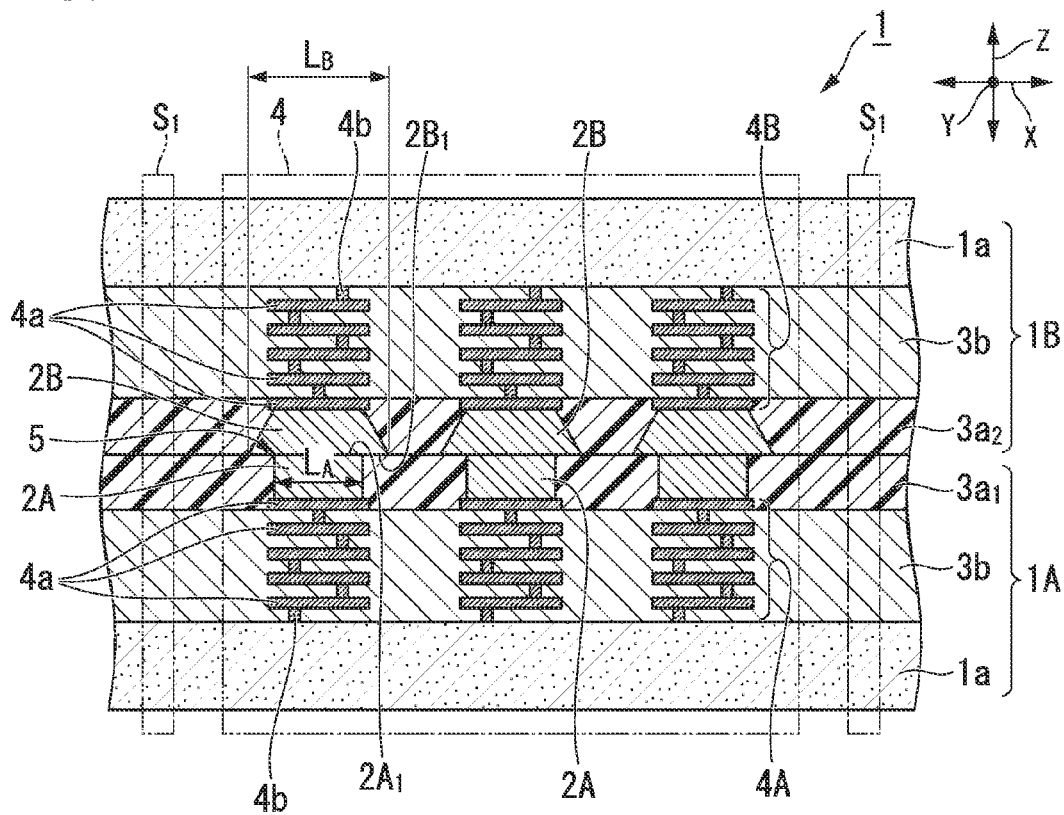
FIG. 2 is a cross-sectional view of FIG. 1 taken along cutting line A-A.

FIG. 1 is a schematic plan view showing a part of a wafer stack 1 which is diced to manufacture semiconductor devices relating to a first embodiment of the present invention. FIG. 2 is a cross-sectional view of FIG. 1 taken along cutting line A-A, in other words, a cross-sectional view of the wafer stack 1 including a lamination direction Z which will be described below.

As shown in FIG. 1 and FIG. 2, the wafer stack 1 has a wafer 1A (first wafer) in which a plurality of circuits 4A are formed on a substrate unit 1a formed of a silicon wafer and a wafer 1B (second wafer) in which a plurality of circuits 4B are formed on another substrate unit 1a formed of a silicon wafer with the wafers 1A and 1B stacked in the lamination direction Z.

The size and the thickness of the substrate unit 1a are not limited in particular. However, when the thickness of the substrate unit 1a is too large, there is a concern that it may be difficult to form a bonding portion 5 to be described below, and thus it is preferable to set the thickness to be, for example, about 500 μm to about 750 μm.

The respective circuits 4A and 4B are arranged in a lattice form in two directions (an X direction and a Y direction in FIG. 1), and are formed in a positional relationship in which the circuits 4A and 4B can be opposite to each other. The shapes of plan views of the circuits 4A and 4B (as will be described below, a circuit 4A and a circuit 4B constitute a circuit unit 4) are not limited in particular, but in this embodiment, the circuits 4A and 4B are formed in areas having almost rectangular shapes (including rectangular shapes) by way of example.

As shown in FIG. 1, the arrangement interval of circuits 4A which are adjacent to each other is, for example, $d_1$ in the X direction and $d_2$ in the Y direction.

The arrangement interval $d_1(d_2)$ is, for example, a larger interval than a line width $d_s$ of a scribe line $S_1(S_2)$ which is set in advance so as to separate chips with a dicing tool (not shown) that uses a dicing blade, a laser, or the like. This is the same for circuits 4B which are adjacent to each other.

Here, the line widths of the scribe lines $S_1$ and $S_2$ are, for example, widths necessary for removal processing determined according to the blade width of the dicing blade or a scribe width in the case of laser dicing.

In this embodiment, the scribe line $S_1$ ($S_2$) is set on a straight line which crosses an approximate center of the arrangement interval $d_1$ ($d_2$) of the circuits 4A (4B).

As shown in FIG. 2, a plurality of electrodes 2A and 2B which are respectively provided to be exposed on the surfaces of one side of the wafer 1A and one side of the wafer 1B are electrically connected to the circuits 4A and 4B.

The respective electrodes 2A and 2B are provided at positions at which exposed surfaces of the respective electrodes 2A and 2B can be opposite to each other when the circuits 4A and 4B are made opposite to each other.

Also, on the surfaces (counterfaces) of the wafers 1A and 1B in which the electrodes 2A and 2B are provided, resin films $3a_1$ and $3a_2$ in a fully cured state are formed in respective regions larger than the scribe lines $S_1$ and $S_2$. The fully cured state mentioned herein means a state in which a resin constituting the resin film $3a_1$ has been heated to a temperature at which the resin is completely cured, and has been completely cured. In other words, the fully cured state means a state in which the resin constituting the resin film $3a_1$ has been heated to a temperature higher than the glass transition point of the resin. This is the same for the resin film $3a_2$.

In this embodiment, the resin films $3a_1$ and $3a_2$ are formed throughout the outermost layer (a layer which is closest to the bonding portion 5) of an interlayer oxide film 3b and wirings 4a to be described below, and electrodes 2A and 2B are embedded in the respective resin films $3a_1$ and $3a_2$. In other words, in the lamination direction Z, the electrodes 2A and 2B are formed in a range in which the resin films $3a_1$ and $3a_2$ are provided.

In general, resins are classified by type into photosensitive resins and non-photosensitive resins, and in this embodiment, a photosensitive resin is used as the resin films $3a_1$ and $3a_2$. It is also possible to use a non-photosensitive resin as the resin film $3a_1$.

Here, on the outer surface of the wafer stack 1, connection electrodes for bonding, for example, circuit units 4 are provided, but not shown in FIG. 1, FIG. 2, or FIG. 4 to be described below (regarding the connection electrodes, see reference sign 7 in FIG. 5)

The wafer stack 1 is a stack obtained by stacking the wafers 1A and 1B having such constitutions, bringing the exposed surfaces of the electrodes 2A and 2B in contact with each other, and bonding the exposed surfaces together.

In the wafer stack 1, the resin films $3a_1$ and $3a_2$ opposite to each other come in contact with each other and are bonded together in a region of the stacked wafers 1A and 1B overlapping the scribe lines $S_1$ and $S_2$.

To this end, in the wafer stack 1, the respective circuits 4A and 4B are stacked to be electrically connected through the electrodes 2A and 2B, and constitute the circuit unit 4 as a whole.

The types of the circuits 4A and 4B constituting the circuit unit 4 are not limited in particular as long as the circuits 4A and 4B are circuits for manufacturing a semiconductor device, and in this embodiment, the circuits 4A and 4B are circuits (solid-state imaging device circuits) for constituting a complementary metal-oxide semiconductor (CMOS)-type imaging device by way of example. Also, only one of the circuits 4A and 4B may be a solid-state imaging device circuit, and the other one may be another electric circuit incidental to the solid-state imaging device circuit.

As the layer configuration of the circuit unit 4, an appropriate configuration according to the type of a circuit to be formed can be employed. For example, as shown in FIG. 2, it is possible to employ a multilayer circuit configuration in which a diffusion layer (not shown) is provided in each of the circuits 4A and 4B on the substrate unit 1a, a plurality of wirings 4a for manufacturing an appropriate circuit are disposed in multiple layers through interlayer oxide films 3b that are interlayer insulating films, and the respective wirings 4a are electrically connected to each other through vias 4b.

Figure 3:
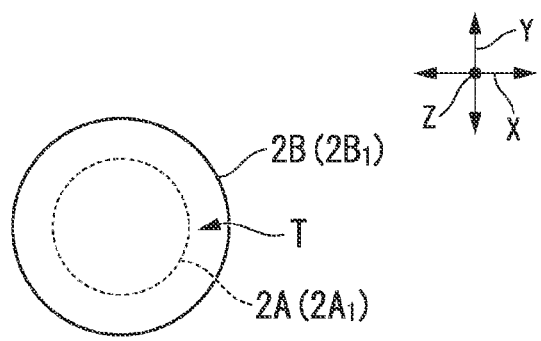
FIG. 3 is a diagram of electrodes of the wafer stack relating to the first embodiment of the present invention shown in a lamination direction.

In this embodiment, as shown in FIG. 2 and FIG. 3, the electrode 2A (the other electrode of at least one pair of chips opposite to each other) is formed in a cylindrical shape extending in the lamination direction Z in which the wafers 1A and 1B are stacked. On the other hand, the electrode 2B (one electrode of the at least one pair of chips opposite to each other) is formed in a truncated cone shape whose diameter increases toward the bonding portion 5 at which the electrodes 2A and 2B are connected to each other. In the cross section shown in FIG. 2, the length of a surface $2A_1$ of the electrode 2A on the side of the bonding portion 5 is set to be shorter than the length of a surface $2B_1$ of the electrode 2B on the side of the bonding portion 5. In addition, when viewed in the lamination direction Z shown in FIG. 3, the surface $2A_1$ of the electrode 2A is formed inside the edge portion of the surface $2B_1$ of the electrode 2B. In this case, between the edge portion of the surface $2B_1$ and the edge portion of the surface $2A_1$, a gap T is formed throughout the edge portion of the surface $2B_1$.

Here, each of the surfaces $2A_1$ and $2B_1$ is formed in a flat shape.

As a material of the electrode 2A (2B), an appropriate metal can be employed as long as the metal can be subjected to surface activated bonding.

One end of the electrode 2A (2B) is electrically connected to the wirings 4a.

In the wafer stack 1, the resin film $3a_1$ of the wafer 1A, the resin film $3a_3$ of the wafer 1B are connected to each other, and the electrodes 2A and 2B are connected to each other, so that the wafers 1A and 1B are connected to each other.

For example, in the cross section shown in FIG. 2, it is assumed that the length of the surface $2A_1$ of the electrode 2A is $L_A$, the length of the surface $2B_1$ of the electrode 2B is $L_B$ (here, $L_B > L_A$), and there is no manufacturing error in the lengths of the electrodes 2A and 2B. At this time, even when a positional displacement of $\Delta = (L_B - L_A)/2$ or less occurs in the X direction due to a positional error upon bonding of the wafers 1A and 1B, the whole surface $2A_1$ of the electrode 2A is opposite to the surface $2B_1$ of the electrode 2B. For this reason, it is possible to electrically connect the electrodes 2A and 2B by means of uniform electric resistance.

Also, since the surface $2A_1$ of the electrode 2A is within the range of the surface $2B_1$ of the electrode 2B, the surface $2A_1$ does not come in contact with another surface $2B_1$ adjacent to the surface $2B_1$, and causes no short circuit.

In practice, there are manufacturing errors in the lengths of the electrodes 2A and 2B, and thus the length $L_A$ of the surface $2A_1$ and the length $L_B$ of the surface $2B_1$ are also appropriately set in consideration of such manufacturing errors.

As materials of the electrodes 2A and 2B, it is possible to employ an appropriate metal having good bonding strength with the wirings 4a. For example, when the wirings 4a are formed of gold (Au), it is possible to suitably employ gold (Au) that is the same material in the electrodes 2A and 2B. In addition, when the wirings 4a are formed of aluminum (Al), it is possible to suitably employ stacked electrodes of nickel (Ni)/gold (Au) in the electrodes 2A and 2B.

Also, as materials of the electrodes 2A and 2B, it is possible to employ an appropriate metal which is readily subjected to surface activation processing to be described below. For example, gold (Au) is suitable. Since a surface oxide film is not formed on Au, the surface activation processing is easy.

Figure 4:
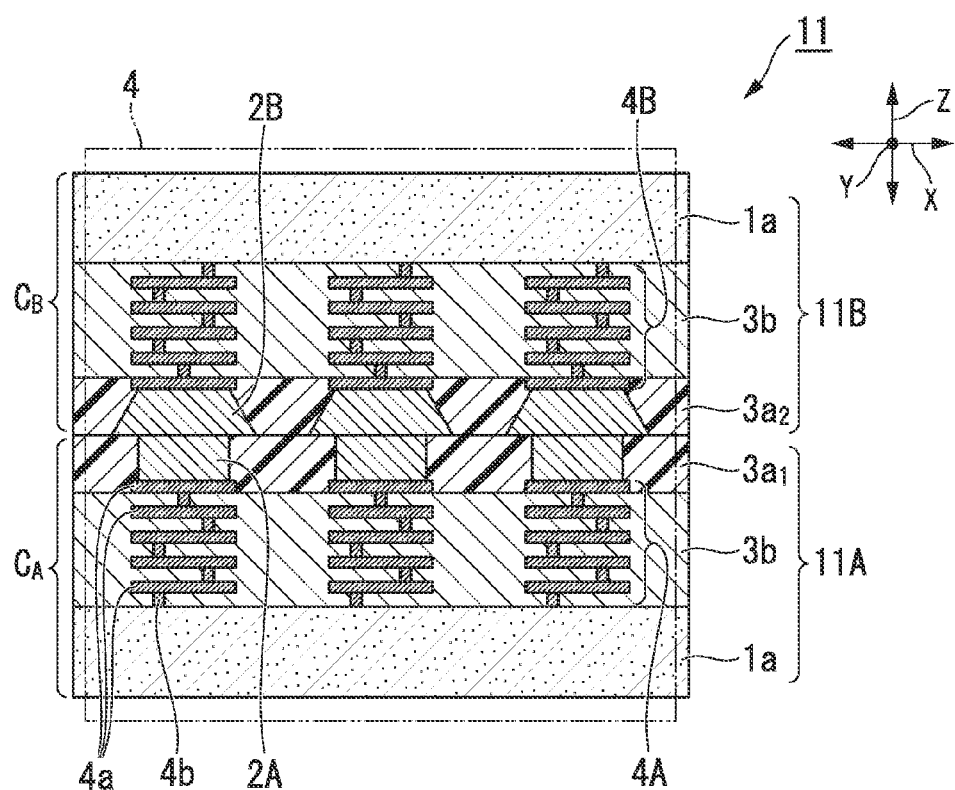
FIG. 4 is a side cross-sectional view of a semiconductor device relating to the first embodiment of the present invention.
Figure 5:
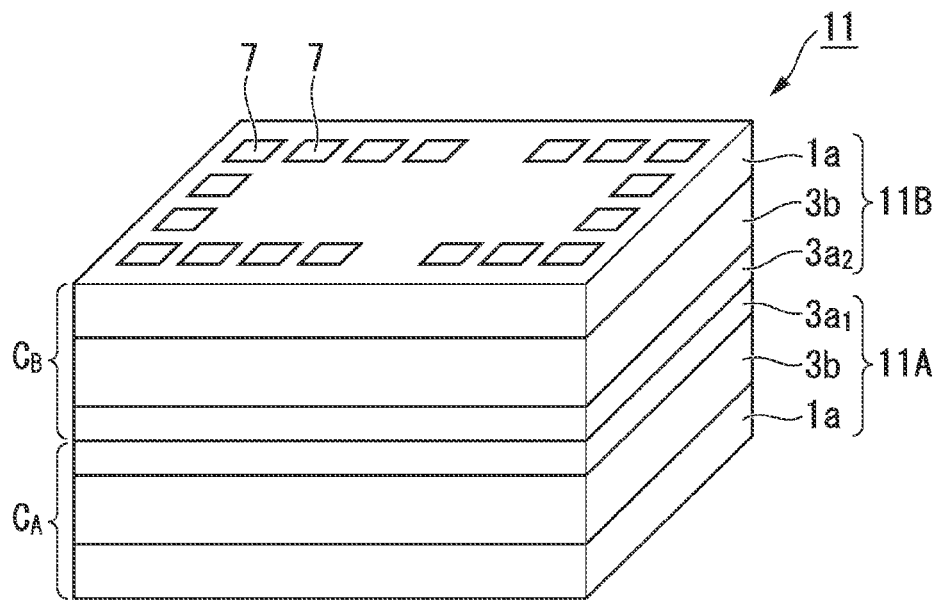
FIG. 5 is a perspective view of the semiconductor device relating to the first embodiment of the present invention.

By dicing the wafer stack 1 constituted as described above along the scribe lines $S_1$ and $S_2$, a semiconductor device 11 (imaging device) shown in FIG. 4 and FIG. 5 is manufactured.

The semiconductor device 11 has a structure in which a chip 11A that is the separated wafer 1A and a chip 11B that is the separated wafer 1B are bonded by the respective resin films $3a_1$ and $3a_2$ and the electrodes 2A and 2B. Around the chips 11A and 11B, cut surfaces $C_A$ and $C_B$ are formed by dicing.

Next, a manufacturing method of the semiconductor device 11 for manufacturing the semiconductor device 11 constituted as described above will be described.

Figure 6:
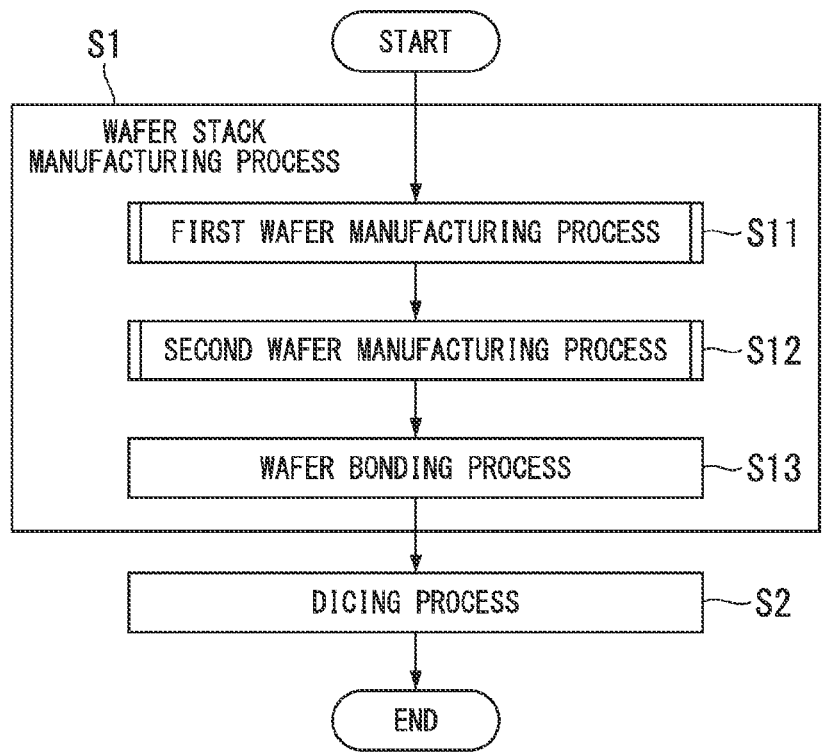
FIG. 6 is a flowchart illustrating a manufacturing method of the semiconductor device relating to the first embodiment of the present invention.
Figure 7:
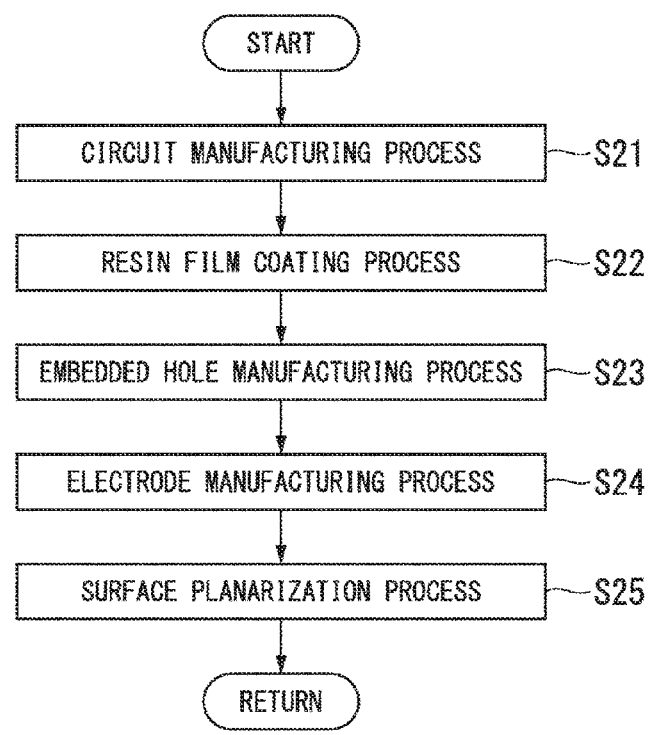
FIG. 7 is a flowchart illustrating a first wafer manufacturing process and a second wafer manufacturing process in the manufacturing method of the semiconductor device relating to the first embodiment of the present invention.

FIG. 6 is a flowchart illustrating a manufacturing method of the semiconductor device 11 relating to the first embodiment of the present invention. FIG. 7 is a flowchart illustrating a first wafer manufacturing process and a second wafer manufacturing process in the manufacturing method of the semiconductor device 11 relating to the first embodiment of the present invention.

In order to manufacture the semiconductor device 11, as illustrated in FIG. 6, a wafer stack manufacturing process S1 of manufacturing the wafer stack 1 in which the wafers 1A and 1B are stacked, and a dicing process S2 of dicing the wafer stack 1 are performed in sequence.

The wafer stack manufacturing process S1 is a process of manufacturing the wafer stack 1, and includes a first wafer manufacturing process S11 of manufacturing the wafer 1A, a second wafer manufacturing process S12 of manufacturing the wafer 1B, and a wafer bonding process S13 of manufacturing the wafer stack 1 by bonding the wafers 1A and 1B.

However, the order of the first wafer manufacturing process S11 and the second wafer manufacturing process S12 is not limited to this. The first wafer manufacturing process S11 and the second wafer manufacturing process S12 may be performed in the reverse order, and may also be performed in parallel.

As shown in FIG. 7, the first wafer manufacturing process S11 includes a circuit manufacturing process S21, a resin film coating process S22, an embedded hole manufacturing process S23, an electrode manufacturing process S24, and a surface planarization process S25.

Figure 8:
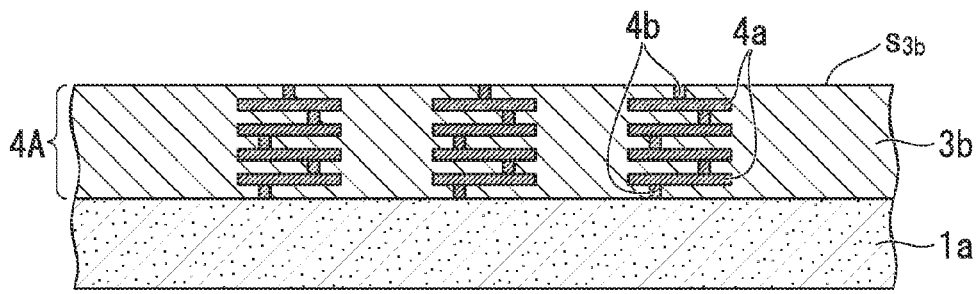
FIG. 8 is a cross-sectional view illustrating the first wafer manufacturing process in the manufacturing method of the semiconductor device relating to the first embodiment of the present invention.

The circuit manufacturing process S21 is a process of manufacturing a plurality of circuits 4A by stacking an interlayer oxide film 3b and wirings 4a on a surface of the substrate unit 1a of a silicon wafer as shown in FIG. 8.

In practice, a plurality of semiconductor devices 11 are simultaneously manufactured, but FIG. 8 only shows one semiconductor device 11 and a circuit 4A corresponding to the semiconductor device 11 (same in the following drawings).

The circuit 4A is formed using a well-known semiconductor manufacturing process.

In other words, a multilayer circuit is formed by manufacturing a diffusion layer (not shown) corresponding to a necessary circuit configuration on the substrate unit 1a and then repeating processes, such as manufacturing, patterning, and etching of the interlayer oxide film 3b, and manufacturing of a via 4b and a wiring 4a.

At this time, on the surface of the substrate unit 1a on which the circuit 4A is formed, a surface $s_{3b}$ which is the outermost layer of the interlayer oxide film 3b and parts of the vias 4b are exposed.

Next, a metal film which is not shown in the drawing is deposited on the surface $s_{3b}$ of the interlayer oxide film 3b and the parts of the vias 4b, that is, the entire surface of the wafer (substrate unit 1a). In this embodiment, gold (Au) is employed as an example of the metal film.

Figure 9:
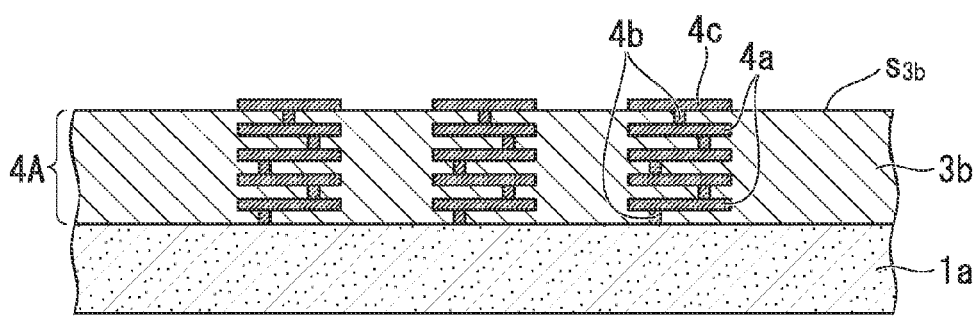
FIG. 9 is a cross-sectional view illustrating the first wafer manufacturing process relating to the first embodiment of the present invention.

By permanufacturing a photolithography process and an etching process on the deposited metal film, base electrodes 4c which are wirings 4a are formed as shown in FIG. 9.

An etching method of the base electrodes 4c can be wet etching or dry etching.

This ends the circuit manufacturing process S21.

Next, the resin film coating process S22 is performed. This process is a process of manufacturing the resin film $3a_1$ which coats the circuit 4A on the surface of the wafer (substrate unit 1a) in which the circuit 4A has been formed.

Figure 10:
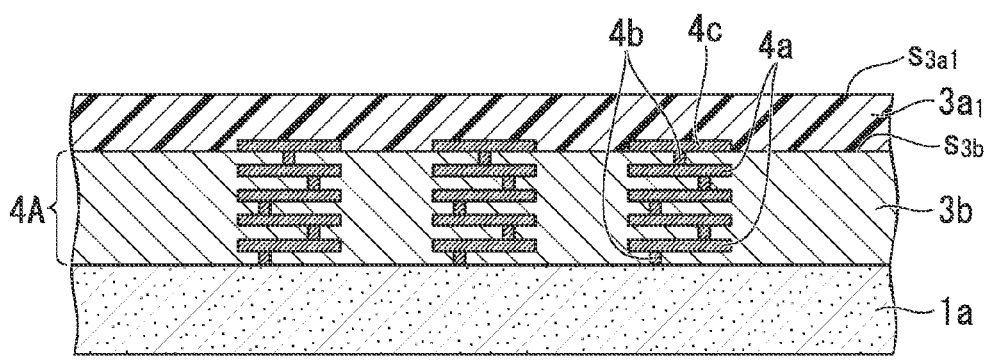
FIG. 10 is a cross-sectional view illustrating the first wafer manufacturing process relating to the first embodiment of the present invention.

In other words, as shown in FIG. 10, the resin film $3a_1$ is formed on the surface $s_{3b}$ of the interlayer oxide film 3b and the exposed base electrodes 4c by a spin coating method or a vacuum stack method, so that the surface $s_{3b}$ and the base electrodes 4c are coated. The coated resin film $3a_1$ is fully cured by heating or the like. Accordingly, the outermost surface of the wafer consists of a surface $s_{3a1}$ of the resin film $3a_1$.

This ends the resin film coating process S22.

Next, the embedded hole manufacturing process S23 is performed. In this process, embedded holes 12a (first hole, see FIG. 11) for embedding electrodes 2A are formed by etching the resin film $3a_1$ which overlaps the base electrodes 4c when viewed in the lamination direction Z.

Figure 11:
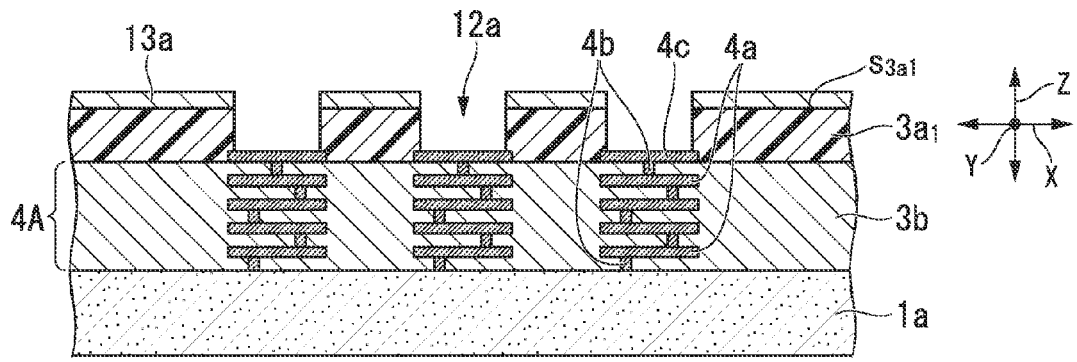
FIG. 11 is a cross-sectional view illustrating the first wafer manufacturing process relating to the first embodiment of the present invention.

More specifically, a mask layer which is a replacement for photoresist is formed on the fully cured resin film $3a_1$, and photoresist is exposed and developed using a photomask. Next, the mask layer is patterned using the photoresist as a mask. After patterning, the photoresist is peeled off. Next, the resin film is etched and patterned using the mask layer. Accordingly, in the pattern which is formed on the surface of the resin film $3a_1$ but is not shown in the drawing, the embedded holes 12a having a column shape extending in the lamination direction Z and shown in FIG. 11 are formed. Accordingly, when an existing photosensitive resin is developed and then hardened by baking, a deformation of the shape of the embedded holes 12a does not occur, and the column shape is maintained with almost no deformation.

The shape of the embedded holes 12a is a hole shape corresponding to the outer shape of the electrodes 2A, and the embedded holes 12a penetrate the resin film $3a_1$ from the surface $s_{3a1}$ of the resin film 3a, to surfaces of the base electrodes 4c to which the electrodes 2A are electrically connected. In other words, the embedded holes 12a form openings having a cylindrical shape on the base electrodes 4c.

As an etching method in this process, anisotropic dry etching is performed on the resin film $3a_1$. Patterning of the embedded holes 12a involves, for example, depositing a metal film 13a on the resin film $3a_1$ and patterning the metal film 13a (corresponding to the aforementioned pattern) by photolithography and dry etching. Next, the metal film 13a patterned as described above is used as a mask to etch the resin film 3a, by anisotropic dry etching.

Finally, the metal film 13a used as a mask is removed. Here, in replacement of the metal film 13a, an oxide film may be used.

This ends the embedded hole manufacturing process S23.

Figure 12:
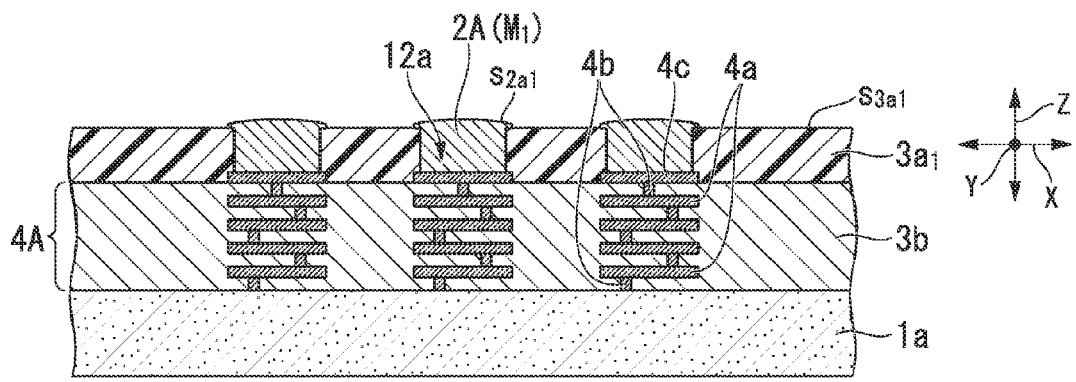
FIG. 12 is a cross-sectional view illustrating the first wafer manufacturing process relating to the first embodiment of the present invention.

Next, the electrode manufacturing process S24 is performed. This process is a process of manufacturing the electrodes 2A by filling the embedded holes 12a with a metal $M_1$ as shown in FIG. 12.

A filling method of the metal $M_1$ can be, for example, an electrolytic plating method, an electroless plating method, a sputtering method, a chemical vapor deposition (CVD) method, a vapor deposition method, or the like.

In this embodiment, the electrodes 2A are formed of gold, and thus gold is filled as the metal $M_1$. In this way, when the filling continues up to a necessary height, the electrodes 2A are formed. However, in order to reduce variations in the heights of the electrodes 2A and form the electrodes 2A to nearly uniform heights, the surface planarization process S25 is provided after this electrode manufacturing process S24 in this embodiment. To this end, in this process, the filling is performed so that the electrodes 2A protrude upward (in the lamination direction Z in which surfaces $s_{2a1}$ of the electrodes 2A are separated from the circuit 4A) from the surface $s_{3a1}$ of the resin film $3a_1$. Accordingly, the embedded holes 12a are completely filled with the metal $M_1$.

This ends the electrode manufacturing process S24.

Next, the surface planarization process S25 is performed. This process is a process of flattening the surface $s_{3a1}$ of the resin film $3a_1$ shown in FIG. 12 and the surfaces $s_{2a1}$ of the electrodes 2A formed by the electrode manufacturing process S24 by polishing processing.

Figure 13:
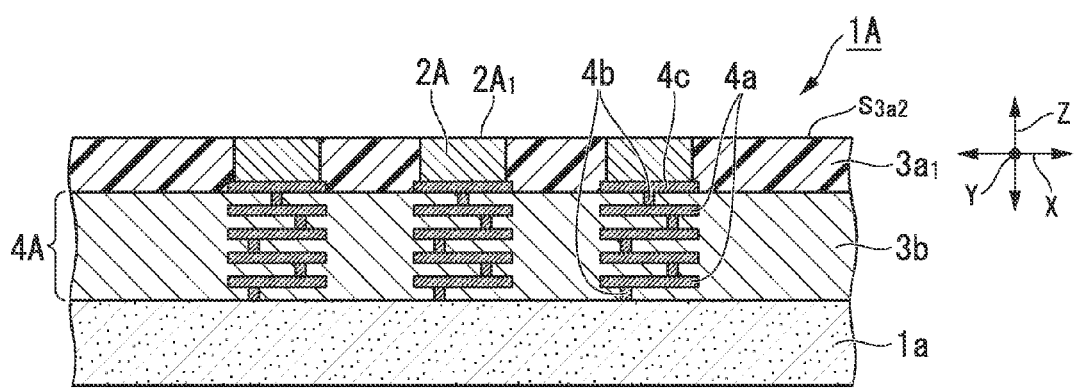
FIG. 13 is a cross-sectional view illustrating the first wafer manufacturing process relating to the first embodiment of the present invention.

In other words, the surface $s_{3a1}$ of the resin film $3a_1$ and the surfaces $s_{2a1}$ of the electrodes 2A protruding from the surface $s_{3a1}$ are subjected to polishing processing and aligned with each other. Accordingly, as shown in FIG. 13, a surface $s_{3a2}$ of the resin film $3a_1$ and surfaces $2A_1$ of the electrodes 2A aligned with the surface $s_{3a2}$ of the resin film $3a_1$ in the X direction are formed.

A polishing processing method of the surface $s_{3a1}$ and the surfaces $2A_1$ is not limited in particular, and can be, for example, chemical mechanical polishing (CMP), a method using both single point cutting and CMP, or the like. In this embodiment, CMP is employed.

This ends the surface planarization process S25.

Then, the first wafer manufacturing process S11 ends with the circuit manufacturing process S21 through the surface planarization process S25, and the wafer 1A is formed.

Subsequently, the second wafer manufacturing process S12 is performed.

The resin film coating process S22, the embedded hole manufacturing process S23, and the electrode manufacturing process S24 in the second wafer manufacturing process S12 differ from the circuit manufacturing process S21 through the surface planarization process S25 performed in the first wafer manufacturing process S11.

In the resin film coating process S22 of the first wafer manufacturing process S11, the resin film $3a_1$ is formed by the spin coating method or the vacuum stack method as shown in FIG. 10, and then the resin film $3a_1$ is fully cured. On the other hand, the resin film coating process S22 of the second wafer manufacturing process S12 is different only in that the formed photosensitive resin film $3a_2$ is left in a semi-cured state. The semi-cured state mentioned herein means a state in which a resin has been heated to a lower temperature than a temperature at which the resin is cured. In other words, the semi-cured state means a state in which the resin constituting the resin film $3a_2$ has been cured at a lower temperature than the glass transition point of the resin.

Figure 14:
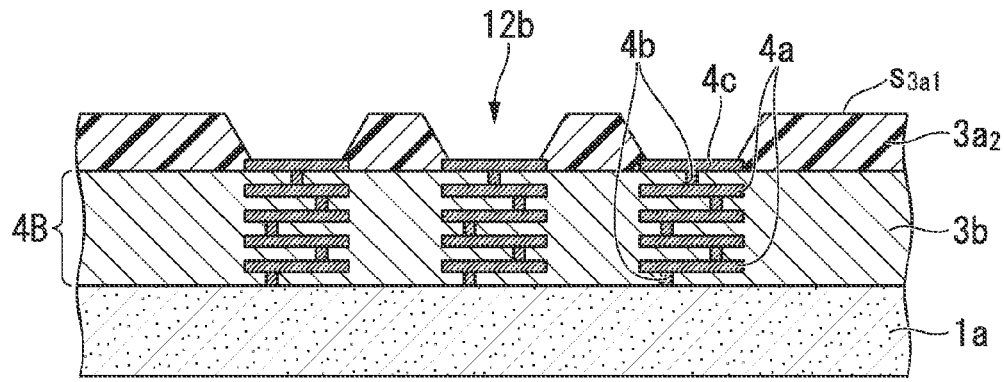
FIG. 14 is a cross-sectional view illustrating the second wafer manufacturing process in the manufacturing method of the semiconductor device relating to the first embodiment of the present invention.

In the embedded hole manufacturing process S23, embedded holes $12b$ (second hole) shown in FIG. 14 are formed by photolithography on the resin film $3a_2$ left in the semi-cured state.

More specifically, a photomask is used on the resin film $3a_2$ left in the semi-cured state to expose and develop the resin film $3a_2$, like processing of general photoresist. Accordingly, in a pattern which is formed on the surface of the resin film $3a_2$ but is not shown in the drawing, the embedded holes $12b$ having a column shape extending in the lamination direction Z are formed. When the photosensitive resin film $3a_2$ is hardened by baking, the shapes of the embedded holes $12b$ sag as shown in FIG. 14, and become taper shapes whose diameters increase outward from the circuit 4B.

The shape of the embedded holes $12b$ is a hole shape corresponding to the outer shape of the aforementioned electrodes 2B, and the embedded holes $12b$ penetrate the resin film $3a_2$ from the surface $s_{3a1}$ of the resin film $3a_2$ to surfaces of the base electrodes $4c$ to which the electrodes 2B are electrically connected. In other words, the embedded holes $12b$ form openings having a truncated cone shape on the base electrodes $4c$.

Figure 15:
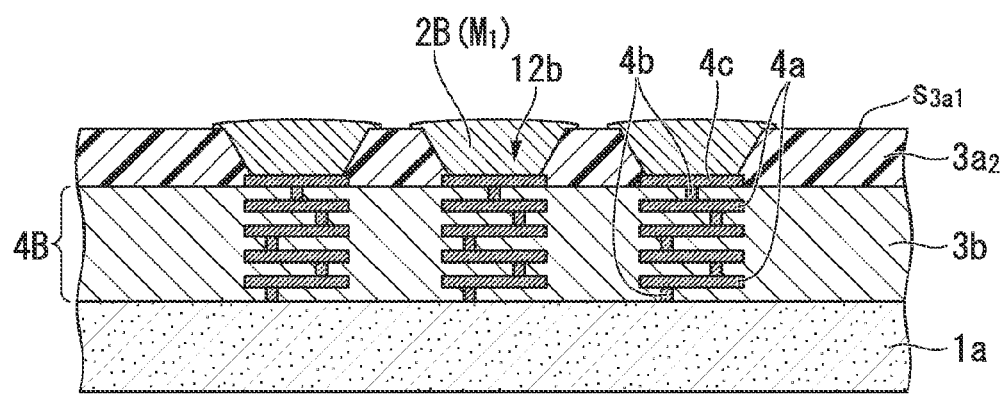
FIG. 15 is a cross-sectional view illustrating the second wafer manufacturing process relating to the first embodiment of the present invention.

In the electrode manufacturing process S24, the electrodes 2B having a truncated cone shape corresponding to the shape of the embedded holes $12b$ are formed by filling the embedded holes $12b$ with a molten metal $M_1$ and hardening the molten metal $M_1$ as shown in FIG. 15.

Figure 16:
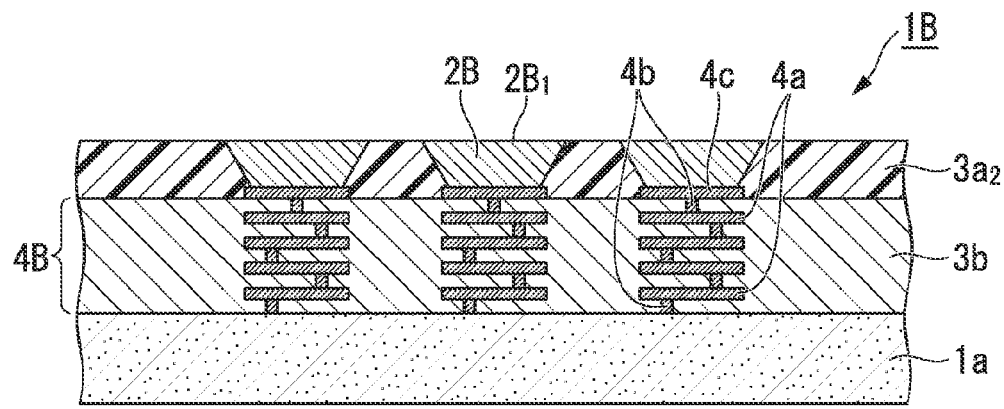
FIG. 16 is a cross-sectional view illustrating the second wafer manufacturing process relating to the first embodiment of the present invention.

Next, in the surface planarization process S25, surfaces $2B_1$ are formed by flattening the electrodes 2B as shown in FIG. 16.

In this way, the wafer 1B is formed, and the second wafer manufacturing process S12 ends.

Next, the wafer bonding process S13 is performed. This process is a process of manufacturing a stack of the wafer 1A and the wafer 1B. In this embodiment, a surface activation process is performed on each of the surfaces $2A_1$ of the electrodes 2A in the wafer 1A and the surfaces $2B_1$ of the electrodes 2B in the wafer 1B. The surfaces $2A_1$ of the electrodes 2A and the surfaces $2B_1$ of the electrodes 2B are brought into contact with each other and bonded, and the resin film $3a$, of the wafer 1A and the resin film $3a_2$ of the wafer 1B are brought into contact with each other and bonded, so that the wafer stack 1 is formed.

First, the surfaces $2A_1$ of the electrodes 2A and the surfaces $2B_1$ of the electrodes 2B in the wafers 1A and 1B are subjected to surface activation processing in the state of vacuum.

As a surface activation method, it is possible to employ, for example, an ion gun beam method, a plasma irradiation method, or the like. Here, it is necessary for at least the surfaces $2A_1$ of the electrodes 2A in the wafer 1A and the surfaces $2B_1$ of the electrodes 2B in the wafer 1B to be subjected to surface activation.

Accordingly, impurities and films on the surfaces $2A_1$ and the surfaces $2B_1$ are removed, and the surfaces $2A_1$ and the surfaces $2B_1$ are activated.

Next, as shown in FIG. 2, the wafers 1A and 1B in which the surfaces of the respective electrodes 2A and 2B have been activated are disposed in an atmosphere chamber in a positional relation in which the electrodes 2A and 2B are opposite to each other.

Then, the wafers 1A and 1B are moved to reduce an opposing interval, thereby bringing the surfaces $2A_1$ of the electrodes 2A and the surfaces $2B_1$ of the electrodes 2B into contact with each other.

At this time, a pressure is applied in a bonding direction (lamination direction Z) of the wafer 1A and the wafer 1B until the pressure reaches a predetermined pressing force, and then the resin film $3a_2$ of the wafer 1B left in the semi-cured state is heated up to a specified temperature at which the resin film $3a_2$ is fully cured.

As a result, the surfaces $2A_1$ of the electrodes 2A and the surfaces $2B_1$ of the electrodes 2B which are opposite to each other are bonded together to form bonding portions 5, and also the resin films $3a_1$ and $3a_2$ of the wafers 1A and 1B are bonded together. Since the resin film $3a_2$ of the wafer 1B has been left in the semi-cured state, it is possible to bond the resin films $3a_1$ and $3a_2$ together with sufficient bonding strength. A pressing method of the wafers 1A and 1B is not limited in particular as long as the respective electrodes 2A and 2B and the respective resin films $3a_1$ and $3a_2$ are bonded together.

This ends the wafer bonding process S13.

In this way, the wafer stack 1 is manufactured, and the wafer stack manufacturing process S1 ends.

Next, the dicing process S2 is performed. This process is a process of dicing the wafer stack 1, and in this embodiment, the wafers 1A and 1B are diced along the scribe lines $S_1$ and $S_2$. As a dicing method, it is possible to employ a well-known method, such as a method of using a dicing blade or the like.

When dicing is performed, all or parts of the scribe lines $S_1$ and $S_2$ are removed in the lamination direction Z by, for example, scribing with the width of a dicing blade or laser irradiation, or the like. Accordingly, as shown in FIG. 4 and FIG. 5, the cut surfaces $C_A$ and $C_B$ are formed by a dicing tool on the sides of the chip 11A separated from the wafer 1A and the chip 11B separated from the wafer 1B, and the semiconductor device 11 is separated.

This ends the dicing process S2.

By dicing the wafer stack 1 in this way, the semiconductor device 11 (imaging device) is manufactured.

As described above, according to the semiconductor device 11 and the manufacturing method of the semiconductor device 11 relating to this embodiment, the electrodes 2A and 2B of the wafer 1A, in which the electrodes 2A are provided with the fully cured resin film $3a_1$, and the wafer 1B, in which the electrodes 2B are provided with the resin film $3a_2$ left in the semi-cured state, are brought into contact with each other, and heated up to a specified temperature at which the resin film $3a_2$ of the wafer 1B is fully cured. Since the resin film $3a_2$ of the wafer 1B has been left in the semi-cured state, it is possible to bond the resin films $3a$, and $3a_2$ together and also to bond the wafers 1A and 1B together with sufficient bonding strength.

In addition, in the wafer 1A, the resin film $3a_1$ is fully cured, and then the embedded holes $12a$ are formed. For this reason, the shapes of the embedded holes $12a$ are hardly deformed, and thus are prevented from becoming taper shapes whose diameters increase outward from the circuit 4A. In this way, it is possible to prevent the electrodes 2A of the metal $M_1$ with which the embedded holes $12a$ are filled from having taper shapes whose diameters increase toward the electrodes 2B which are targets for bonding.

In a cross section of the wafer stack 1 including the lamination direction Z, the length of the surfaces $2A_1$ of the electrodes 2A is set to be shorter than the length of the surfaces $2B_1$ of the electrodes 2B. For this reason, when the wafers 1A and 1B are bonded together, even if the electrodes 2A are bonded to the electrodes 2B but are out of alignment with the electrodes 2B in the X direction in the cross section, bonding areas between the electrodes 2A and 2B are uniform, so that the electrodes 2A and 2B can be electrically connected by means of a uniform electric resistance. Further, even when an electrode 2A is bonded to an electrode 2B but is out of alignment with the electrode 2B in the X direction in the cross section, it is possible to prevent the electrode 2A from coming in contact with another electrode 2B which is adjacent to the electrode 2B.

When viewed in the lamination direction Z, the surfaces $2A_1$ of the electrodes 2A are formed inside the edge portions of the surfaces $2B_1$ of the electrodes 2B. For this reason, even when the electrodes 2A are bonded to the electrodes 2B but are out of alignment with the electrodes 2B not only in the X direction but also in the Y direction, bonding areas between the electrodes 2A and 2B are uniform, so that the electrodes 2A and 2B can be electrically connected by means of a uniform electric resistance.

Thus far, the first embodiment of the present invention has been described in detail with reference to drawings. However, a detailed configuration is not limited to this embodiment, and variations, combinations, and the like in the configuration within a range not departing from the spirit of the present invention are also included.

For example, in the first embodiment, it has been described that the lengths of the surfaces $2A_1$ of the electrodes 2A in the cross section shown in FIG. 2 are set to be shorter than the lengths of the surfaces $2B_1$ of the electrodes 2B, and the surfaces $2A_1$ of the electrodes 2A are formed inside the edge portions of the surfaces $2B_1$ of the electrodes 2B when viewed in the lamination direction Z.

Figure 17:
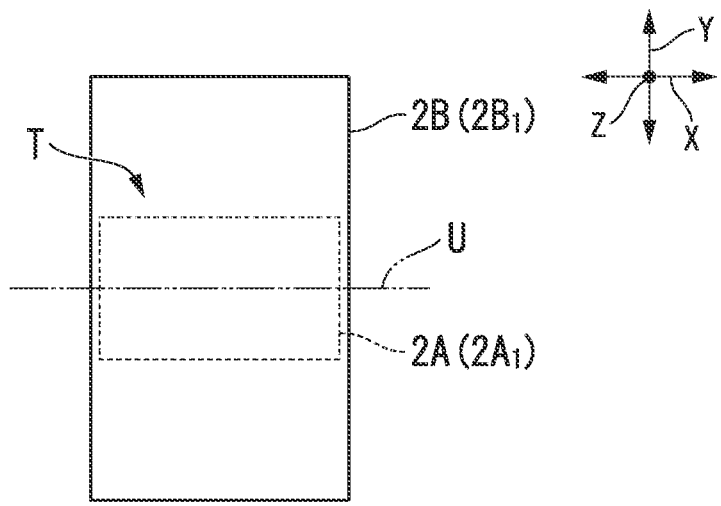
FIG. 17 is a diagram of electrodes in the semiconductor device relating to a variant example of the first embodiment of the present invention shown in a lamination direction.

However, the shapes of the surfaces $2A_1$ of the electrodes 2A and the surfaces $2B_1$ of the electrodes 2B are not limited to this case. For example, as shown in FIG. 17, the lengths of the surfaces $2A_1$ of the electrodes 2A may be set to be identical to the lengths of the surfaces $2B_1$ of the electrodes 2B in a cross section according to a reference plane U corresponding to the cross section shown in FIG. 2, and when viewed from the lamination direction Z, the surfaces $2A_1$ of the electrodes 2A may be formed inside the edge portions of the surfaces $2B_1$ of the electrodes 2B. In this case, between the edge portions of the surfaces $2B_1$ and the edge portions of the surfaces $2A_1$, a gap T is formed in parts of the edge portions of the surfaces $2B_1$.

Figure 18:
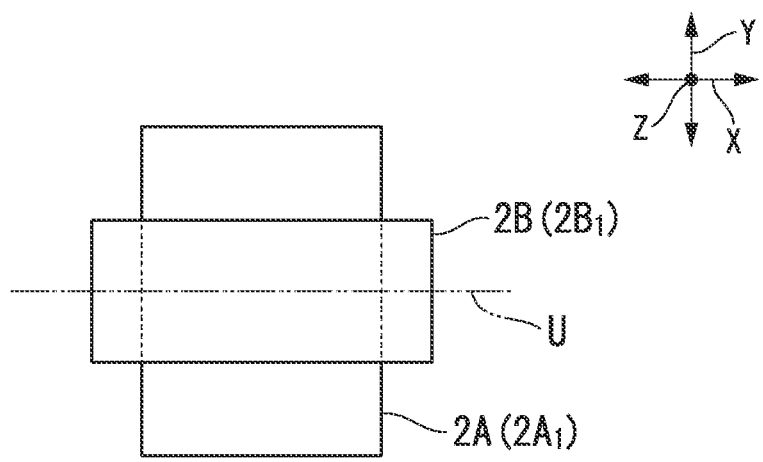
FIG. 18 is a diagram of electrodes in the semiconductor device relating to a variant example of the first embodiment of the present invention shown in a lamination direction.
Figure 19:
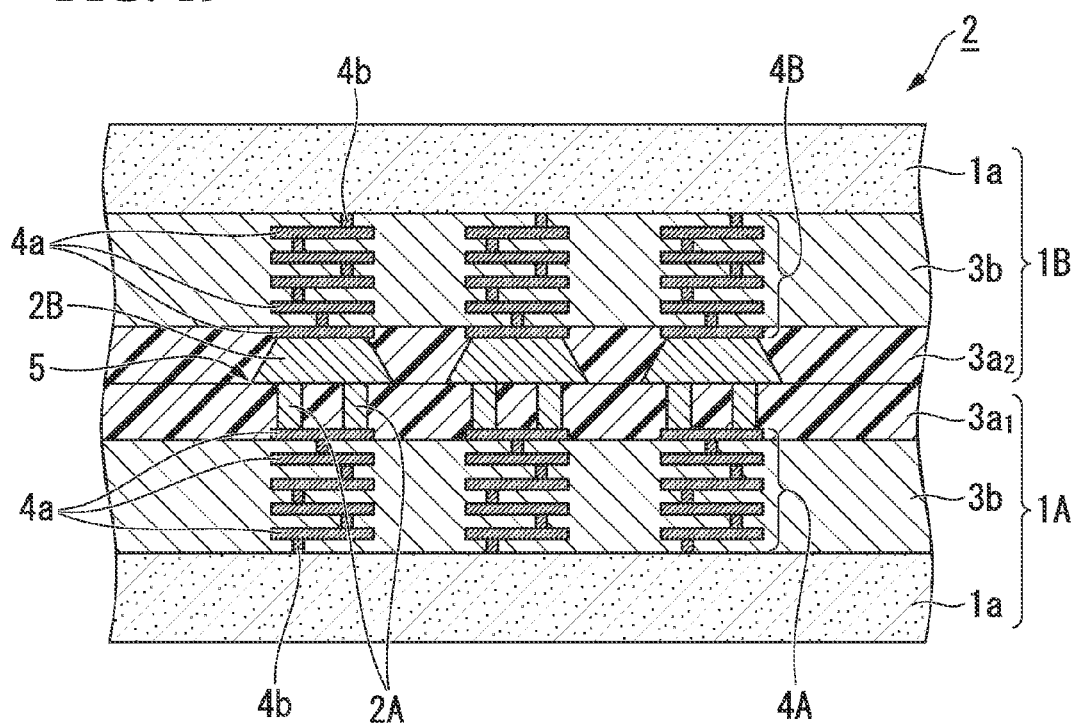
FIG. 19 is a side cross-sectional view of a semiconductor device relating to a variant example of the first embodiment of the present invention.

In addition, for example, as shown in FIG. 18, the lengths of the surfaces $2A_1$ of the electrodes 2A may be set to be shorter than the lengths of the surfaces $2B_1$ of the electrodes 2B in the cross section according to the reference plane U, and when viewed from the lamination direction Z, the surfaces $2A_1$ of the electrodes 2A may be configured not to be formed inside the edge portions of the surfaces $2B_1$ of the electrodes 2B.

It has been described that one electrode 2A is bonded to each electrode 2B, but there is no limit to the number of electrodes 2A bonded to each electrode 2B. For example, as in a wafer stack 2 shown in FIG. 19, two electrodes 2A may be bonded to each electrode 2B.

In the first embodiment, it has been described that the electrodes 2A are formed in a cylindrical shape extending in the lamination direction Z. However, the shape of the electrodes 2A is not limited to the cylindrical shape, and is not limited in particular as long as the shape is a column shape. The bottom shape of an electrode formed in a column shape may be an elliptical shape, a polygonal shape, or the like. Further, as long as an increase in the diameter of the electrodes 2A toward the bonding portions 5 is set to be smaller than that of the electrodes 1B, the electrodes 2A may also be formed in a truncated cone shape whose diameter increases toward the bonding portions 5.

It has been described that the first wafer manufacturing process S11 includes the surface planarization process S25, but the surface planarization process S25 can be omitted when it is possible to uniformize the heights of surfaces of the respective electrodes 2A without causing a problem in bonding between the electrodes 2A and 2B. This is the same for the surface planarization process S25 of the second wafer manufacturing process S12.

In the first embodiment, it has been described that the two wafers 1A and 1B constitute the wafer stack 1, and the two chips 11A and 11B constitute the semiconductor device 11. However, the number of wafers provided in a wafer stack may be three or more, and the number of chips provided in a semiconductor device may be three or more.

The present invention can be widely applied to a semiconductor device, an imaging device, and a semiconductor device manufacturing method, and can prevent electrodes from having taper shapes whose diameters increase toward electrodes that are targets for bonding while securely bonding resin films together.

What is claimed is:

1. A semiconductor device manufacturing method comprising:
    a wafer stack manufacturing process of manufacturing a wafer stack in which a plurality of wafers comprising circuits and electrodes electrically connected to the circuits are stacked; and
    a dicing process of dicing the wafer stack,
    wherein the wafer stack manufacturing process comprises:
    a first wafer manufacturing process of manufacturing a resin film covering the plurality of circuits and heated to a temperature higher than a glass transition point of the resin film, manufacturing first holes extending from a surface of the resin film to wirings of the circuits, and providing the electrodes electrically connected to the wirings in the first holes to form a first wafer;
    a second wafer manufacturing process of manufacturing a resin film covering the plurality of circuits and heated to a temperature lower than a glass transition point of the resin film, manufacturing second holes extending from a surface of the resin film to wirings of the circuits, and providing the electrodes electrically connected to the wirings in the second holes to form a second wafer; and
    a wafer bonding process of causing respective electrode sides of the first wafer and the second wafer to be opposite to each other, bonding the respective resin films together by heating the resin film of the second wafer to a temperature higher than the glass transition point, and bonding the respective electrodes together to form a stack of the first wafer and the second wafer constituting at least a part of the wafer stack.

2. The semiconductor device manufacturing method according to claim 1,
    wherein, in a cross section including a lamination direction in which the plurality of wafers are stacked, a length of surfaces of the electrodes of the first wafer on a bonding-portion side between the electrodes of the first wafer and the electrodes of the second wafer is shorter than a length of surfaces of the electrodes of the second wafer on the bonding-portion side.

3. The semiconductor device manufacturing method according to claim 1,
wherein, when the semiconductor device is viewed in a lamination direction in which the plurality of wafers are stacked, surfaces of the electrodes of the first wafer on a bonding-portion side between the electrodes of the first wafer and the electrodes of the second wafer are formed in edge portions of surfaces of the electrodes of the second wafer on the bonding-portion side.

* * * * *